(12) United States Patent
Sakaue et al.

(10) Patent No.: US 8,453,034 B2
(45) Date of Patent: May 28, 2013

(54) ERROR DETECTION/CORRECTION CIRCUIT, MEMORY CONTROLLER AND SEMICONDUCTOR MEMORY APPARATUS

(75) Inventors: Kenji Sakaue, Kanagawa (JP); Tatsuyuki Ishikawa, Kanagawa (JP); Yukio Ishikawa, Kanagawa (JP); Kazuhiro Ichikawa, Kanagawa (JP); Hironori Uchikawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 295 days.

(21) Appl. No.: 13/039,961

(22) Filed: Mar. 3, 2011

(65) Prior Publication Data
US 2011/0239080 A1 Sep. 29, 2011

(30) Foreign Application Priority Data
Mar. 26, 2010 (JP) .................................. 2010-073411

(51) Int. Cl.
*H03M 13/00* (2006.01)

(52) U.S. Cl.
USPC ........................................ 714/758; 714/779

(58) Field of Classification Search
USPC .................................. 714/758, 779
See application file for complete search history.

(56) References Cited

U.S. PATENT DOCUMENTS

| 6,633,856 | B2 * | 10/2003 | Richardson et al. ............ 706/15 |
| 7,072,417 | B1 * | 7/2006 | Burd et al. ..................... 375/295 |
| 2004/0034828 | A1 * | 2/2004 | Hocevar ........................ 714/800 |
| 2004/0148560 | A1 * | 7/2004 | Hocevar ........................ 714/801 |
| 2006/0107179 | A1 | 5/2006 | Shen et al. |
| 2009/0063931 | A1 * | 3/2009 | Rovini et al. ................. 714/758 |

OTHER PUBLICATIONS

U.S. Appl. No. 12/791,210, filed Jun. 1, 2010, Kenji Sakaue et al.

* cited by examiner

*Primary Examiner* — M. Mujtaba K Chaudry
(74) *Attorney, Agent, or Firm* — Oblon, Spivak, McClelland, Maier & Neustadt, L.L.P.

(57) ABSTRACT

An LDPC error detection/correction circuit according to an embodiment includes a selector that divides data into p groups based on a check matrix H including blocks made up of unit matrixes having a size p and shift blocks, a selector that divides a group into Y subgroups, a bit node storage section that stores LMEM variables to calculate a probability β in association with each first address, a check node storage section that stores TMEM variables to calculate an external value α in association with each second address, a rotator that performs rotation processing on the TMEM with a rotation value based on a shift value, and an operation circuit made up of (p/Y) operation units that perform parallel processing in subgroup units.

12 Claims, 21 Drawing Sheets

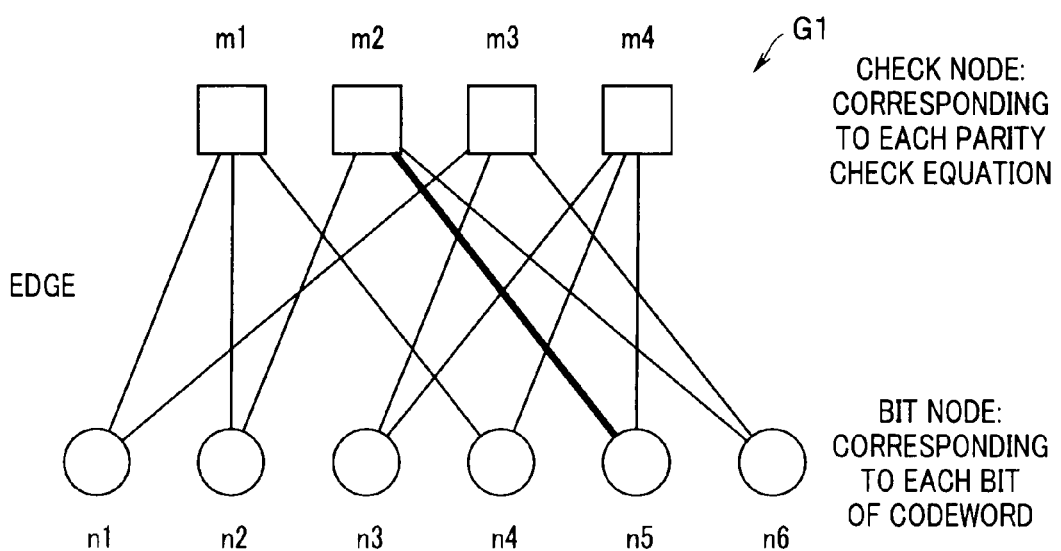

FIG.4A

| | m1 | m2 | m3 | m4 | m5 | m6 | m7 | m8 | m9 | m10 | m11 | m12 | m13 | m14 | m15 | P1 | P2 | P3 | P4 | P5 | P6 | P7 | P8 | P9 | P10 | P11 | P12 | P13 | P14 | P15 |
|---|---|---|---|---|---|---|---|---|---|---|---|---|---|---|---|---|---|---|---|---|---|---|---|---|---|---|---|---|---|---|
| 1ST ROW | 1 | | | | | | | | | | | | | | | | | | | | | | | | | | | | | |
| 2ND ROW | | 1 | | | | | | | | | | | | | | | | | | | | | | | | | | | | |
| 3RD ROW | | | | 1 | | | | | | | | | | | | | | | | | | | | | | | | | | |
| 4TH ROW | | | | | | | 1 | | | | | | | | | | | | | | | | | | | | | | | |
| 5TH ROW | 1 | | | | | | | | | | | 1 | | | | | | | | | | | | | | | | | | |
| 6TH ROW | | | | | 1 | | | | | | | | | | | | 1 | | | | | | | | | | | | | |
| 7TH ROW | | | 1 | | | | | | | | | | | | | | | | | 1 | | | | | | | | | | |
| 8TH ROW | | | | | | | | 1 | | | | | | | | | | | | | | | 1 | | | | | | | |
| 9TH ROW | 1 | | | | | | | | | | 1 | | | | | | | | | | | 1 | | | | 1 | | | | |
| 10TH ROW | | | | | | 1 | | | | | | | | | | 1 | | | | | 1 | | | | | | | | | 1 |
| 11TH ROW | 1 | | | | | | | | | | | | 1 | | | 1 | | | | 1 | | | | | | | | 1 | | |
| 12TH ROW | 1 | | | | | | | 1 | | | | | | | | | | 1 | | | | | 1 | | | | | | | 1 |
| 13TH ROW | | | 1 | | | | | | | 1 | | | | | | | 1 | | | | | | | | 1 | | | 1 | | |
| 14TH ROW | | | | | | | | | 1 | | | | | 1 | | | | | 1 | | | | | 1 | | | | | 1 | |
| 15TH ROW | 1 | | | | | 1 | | | | | | | | | 1 | 1 | | | | | 1 | | | | | 1 | | | | 1 | p = 5, p = 5, H3

FIG.4B

| ROW → | COLUMN → | | | | | | |
|---|---|---|---|---|---|---|---|
| | 1 | 3 | 2 | 2 | 0 | -1 | 0 |
| | 2 | 1 | 3 | 0 | 0 | 0 | 0 |
| | 4 | 2 | 1 | 2 | 0 | -1 | 0 |
| | H3A | | | H3B | | | |

|   | L0 | L1 | L2 | L3 | L4 | L5 | L6 | L7 |    |
|---|----|----|----|----|----|----|----|----|----|
|   | 1  | 0  | 0  | 0  | 0  | 0  | 0  | 0  | T0 |
|   | 0  | 1  | 0  | 0  | 0  | 0  | 0  | 0  | T1 |
|   | 0  | 0  | 1  | 0  | 0  | 0  | 0  | 0  | T2 |
|   | 0  | 0  | 0  | 1  | 0  | 0  | 0  | 0  | T3 |
|   | 0  | 0  | 0  | 0  | 1  | 0  | 0  | 0  | T4 |
|   | 0  | 0  | 0  | 0  | 0  | 1  | 0  | 0  | T5 |
|   | 0  | 0  | 0  | 0  | 0  | 0  | 1  | 0  | T6 |
|   | 0  | 0  | 0  | 0  | 0  | 0  | 0  | 1  | T7 |

FIG.5B

|   | L0 | L1 | L2 | L3 | L4 | L5 | L6 | L7 |    |
|---|----|----|----|----|----|----|----|----|----|
|   | 0  | 1  | 0  | 0  | 0  | 0  | 0  | 0  | T0 |
|   | 0  | 0  | 1  | 0  | 0  | 0  | 0  | 0  | T1 |
|   | 0  | 0  | 0  | 1  | 0  | 0  | 0  | 0  | T2 |
|   | 0  | 0  | 0  | 0  | 1  | 0  | 0  | 0  | T3 |
|   | 0  | 0  | 0  | 0  | 0  | 1  | 0  | 0  | T4 |
|   | 0  | 0  | 0  | 0  | 0  | 0  | 1  | 0  | T5 |
|   | 0  | 0  | 0  | 0  | 0  | 0  | 0  | 1  | T6 |
|   | 1  | 0  | 0  | 0  | 0  | 0  | 0  | 0  | T7 |

FIG.7

| SHIFT VALUE | LMEM<br>VARIABLE ADDRESS | TMEM<br>VARIABLE ADDRESS | ROTATION VALUE |
|---|---|---|---|
| 0 | 0, 1, 2, 3, 4, 5, 6, 7 | 0, 1, 2, 3, 4, 5, 6, 7 | 0 |
| 1 | 0, 1, 2, 3, 4, 5, 6, 7 | 0, 1, 2, 3, 4, 5, 6, 7 | 1 |
| 2 | 0, 1, 2, 3, 4, 5, 6, 7 | 0, 1, 2, 3, 4, 5, 6, 7 | 2 |
| 3 | 0, 1, 2, 3, 4, 5, 6, 7 | 0, 1, 2, 3, 4, 5, 6, 7 | 3 |
| 4 | 0, 1, 2, 3, 4, 5, 6, 7 | 0, 1, 2, 3, 4, 5, 6, 7 | 4 |
| 5 | 0, 1, 2, 3, 4, 5, 6, 7 | 0, 1, 2, 3, 4, 5, 6, 7 | 5 |
| 6 | 0, 1, 2, 3, 4, 5, 6, 7 | 0, 1, 2, 3, 4, 5, 6, 7 | 6 |
| 7 | 0, 1, 2, 3, 4, 5, 6, 7 | 0, 1, 2, 3, 4, 5, 6, 7 | 7 |

FIG.14

| SHIFT VALUE | STEP | LMEM VARIABLE ADDRESS | TMEM VARIABLE ADDRESS | ROTATION VALUE |
|---|---|---|---|---|
| 0 | 1 | 0, 1, 2, 3 | 0, 1, 2, 3 | 0 |
|   | 2 | 4, 5, 6, 7 | 4, 5, 6, 7 | 0 |
| 1 | 1 | 0, 1, 2, 3 | 4, 5, 6, 7 | 1 |
|   | 2 | 4, 5, 6, 7 | 0, 1, 2, 3 | 0 |
| 2 | 1 | 0, 1, 2, 3 | 0, 1, 2, 3 | 1 |
|   | 2 | 4, 5, 6, 7 | 4, 5, 6, 7 | 1 |
| 3 | 1 | 0, 1, 2, 3 | 4, 5, 6, 7 | 2 |
|   | 2 | 4, 5, 6, 7 | 0, 1, 2, 3 | 1 |
| 4 | 1 | 0, 1, 2, 3 | 0, 1, 2, 3 | 2 |
|   | 2 | 4, 5, 6, 7 | 4, 5, 6, 7 | 2 |
| 5 | 1 | 0, 1, 2, 3 | 4, 5, 6, 7 | 3 |
|   | 2 | 4, 5, 6, 7 | 0, 1, 2, 3 | 2 |
| 6 | 1 | 0, 1, 2, 3 | 0, 1, 2, 3 | 3 |
|   | 2 | 4, 5, 6, 7 | 4, 5, 6, 7 | 3 |
| 7 | 1 | 0, 1, 2, 3 | 4, 5, 6, 7 | 4(0) |
|   | 2 | 4, 5, 6, 7 | 0, 1, 2, 3 | 3 |

FIG.18

| SHIFT VALUE | STEP | LMEM VARIABLE ADDRESS | TMEM VARIABLE ADDRESS | ROTATION VALUE |
|---|---|---|---|---|
| 0 | 1 | 0, 2, 4, 6 | 0, 2, 4, 6 | 0 |
|   | 2 | 1, 3, 5, 7 | 1, 3, 5, 7 | 0 |
| 1 | 1 | 0, 2, 4, 6 | 1, 3, 5, 7 | 1 |
|   | 2 | 1, 3, 5, 7 | 0, 2, 4, 6 | 0 |
| 2 | 1 | 0, 2, 4, 6 | 0, 2, 4, 6 | 1 |
|   | 2 | 1, 3, 5, 7 | 1, 3, 5, 7 | 1 |
| 3 | 1 | 0, 2, 4, 6 | 1, 3, 5, 7 | 2 |
|   | 2 | 1, 3, 5, 7 | 0, 2, 4, 6 | 1 |
| 4 | 1 | 0, 2, 4, 6 | 0, 2, 4, 6 | 2 |
|   | 2 | 1, 3, 5, 7 | 1, 3, 5, 7 | 2 |
| 5 | 1 | 0, 2, 4, 6 | 1, 3, 5, 7 | 3 |
|   | 2 | 1, 3, 5, 7 | 0, 2, 4, 6 | 2 |
| 6 | 1 | 0, 2, 4, 6 | 0, 2, 4, 6 | 3 |
|   | 2 | 1, 3, 5, 7 | 1, 3, 5, 7 | 3 |
| 7 | 1 | 0, 2, 4, 6 | 1, 3, 5, 7 | 4(0) |
|   | 2 | 1, 3, 5, 7 | 0, 2, 4, 6 | 3 |

FIG.22

| SHIFT VALUE | STEP | LMEM VARIABLE ADDRESS | TMEM VARIABLE ADDRESS | ROTATION VALUE |
|---|---|---|---|---|
| 0 | 1 | 0, 4 | 0, 4 | 0 |
| 0 | 2 | 1, 5 | 1, 5 | 0 |
| 0 | 3 | 2, 6 | 2, 6 | 0 |
| 0 | 4 | 3, 7 | 3, 7 | 0 |
| 1 | 1 | 0, 4 | 3, 7 | 1 |
| 1 | 2 | 1, 5 | 0, 4 | 0 |
| 1 | 3 | 2, 6 | 1, 5 | 1 |
| 1 | 4 | 3, 7 | 2, 6 | 0 |
| 2 | 1 | 0, 4 | 2, 6 | 1 |
| 2 | 2 | 1, 5 | 3, 7 | 1 |
| 2 | 3 | 2, 6 | 0, 4 | 0 |
| 2 | 4 | 3, 7 | 1, 5 | 0 |
| 3 | 1 | 0, 4 | 1, 5 | 1 |
| 3 | 2 | 1, 5 | 2, 6 | 1 |
| 3 | 3 | 2, 6 | 3, 7 | 1 |
| 3 | 4 | 3, 7 | 0, 4 | 0 |
| 4 | 1 | 0, 4 | 0, 4 | 1 |
| 4 | 2 | 1, 5 | 1, 5 | 1 |
| 4 | 3 | 2, 6 | 2, 6 | 1 |
| 4 | 4 | 3, 7 | 3, 7 | 1 |
| 5 | 1 | 0, 4 | 3, 7 | 1 |
| 5 | 2 | 1, 5 | 0, 4 | 1 |
| 5 | 3 | 2, 6 | 1, 5 | 1 |
| 5 | 4 | 3, 7 | 2, 6 | 1 |
| 6 | 1 | 0, 4 | 2, 6 | 0 |
| 6 | 2 | 1, 5 | 3, 7 | 1 |
| 6 | 3 | 2, 6 | 0, 4 | 1 |
| 6 | 4 | 3, 7 | 1, 5 | 1 |
| 7 | 1 | 0, 4 | 1, 5 | 0 |
| 7 | 2 | 1, 5 | 2, 6 | 0 |
| 7 | 3 | 2, 6 | 3, 7 | 1 |
| 7 | 4 | 3, 7 | 0, 4 | 0 |

US 8,453,034 B2

ERROR DETECTION/CORRECTION CIRCUIT, MEMORY CONTROLLER AND SEMICONDUCTOR MEMORY APPARATUS

CROSS REFERENCE TO RELATED APPLICATION

This application claims the benefit of Japanese Application No. 2010-073411 filed in Japan on Mar. 26, 2010, the contents of which are incorporated herein by this reference.

FIELD

Embodiments described herein relate generally to an error detection/correction circuit configured to perform decoding processing on LDPC-coded data, a memory controller including the error detection/correction circuit and a semiconductor memory apparatus including the error detection/correction circuit.

BACKGROUND

For high density recording or the like in the storage field of semiconductor memories and the like, development related to digital data error correcting codes is underway. The error correcting codes can be roughly divided into an error correcting scheme based on an algebraic system and an error correcting scheme using iterative calculation based on probability. Low density parity check codes (hereinafter referred to as "LDPC codes") that belong to the latter are reported to have excellent performance nearing a Shannon limit.

LDPC-coded data can be subjected to parallel processing with a relatively small circuit scale by using a sum-product algorithm, a minisum algorithm or the like. However, applying complete parallel processing that performs all processing in parallel to LDPC-coded data of a large code length requires all of many operation circuits to be mounted, and is therefore not realistic.

For this reason, for example, Japanese Patent Application Laid-Open Publication No. 2006-279396 discloses a decoding apparatus that performs partial parallel processing using a check matrix having a configuration in which square matrixes are arranged.

BRIEF DESCRIPTION OF THE DRAWINGS

FIG. 1 is a diagram illustrating a check matrix H1;

FIG. 2 is a diagram illustrating a Tanner graph G1;

FIG. 4A is a check matrix H2 used for partial parallel processing;

FIG. 4B illustrates a shift value for each block used for partial parallel processing;

FIG. 5A is a diagram illustrating a shift of a block in a check matrix H3 and illustrates a block with shift value=0;

FIG. 5B is a diagram illustrating a shift of a block in the check matrix H3 and illustrates a block with shift value=1;

FIG. 7 is a diagram illustrating shift processing on a publicly known error detection/correction circuit;

FIG. 14 is a diagram illustrating shift processing on the error detection/correction circuit of the first embodiment;

FIG. 18 is a diagram illustrating shift processing on the error detection/correction circuit of the second embodiment;

FIG. 22 is a diagram illustrating shift processing on the error detection/correction circuit of the third embodiment.

DETAILED DESCRIPTION

<LDPC Code and Partial Parallel Processing>

Figure 3A:
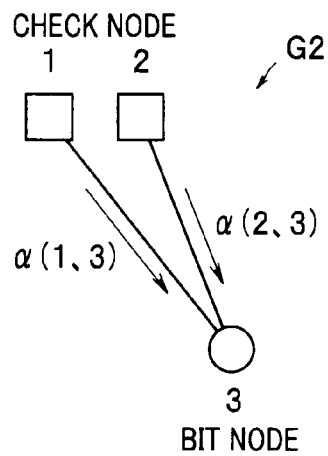
FIG. 3A to FIG. 3D are diagrams illustrating row processing and column processing in the case of a Tanner graph G2.

First, an LDPC code and partial parallel processing will be described. The LDPC code is a linear code defined by a very sparse check matrix, that is, a check matrix including a very few number of non-zero elements and can be expressed by a Tanner graph. The error correcting processing corresponds to exchanging and updating results of local inferences between a bit node corresponding to each bit of a codeword and a check node corresponding to each parity check equation connected on a Tanner graph.

FIG. 1 illustrates a check matrix H1 with row weight wr=3 and column weight wc=2 in a (6, 2) LDPC code. The "(6, 2) LDPC code" is an LDPC code having a code length of 6 bits and an information length of 2 bits.

As shown in FIG. 2, when a check matrix H1 is expressed by a Tanner graph G1, the bit node corresponds to a column of a check matrix H and the check node corresponds to a row of the check matrix H. The Tanner graph G1 is configured by connecting nodes which are "1"s among elements of the check matrix H1 with edges. For example, "1" encircled on the second row and the fifth column of the check matrix H1 corresponds to an edge shown by a thick line of the Tanner graph G1. Row weight wr=3 of the check matrix H1 corresponds to the number of bit nodes connected to one check node, that is, the number of edges=3 and column weight wc=2 of the check matrix H corresponds to the number of check nodes connected to the bit node, that is, the number of edges=2.

The decoding processing on an LDPC code is performed by iteratively updating reliability (probability) information assigned to edges of the Tanner graph at the nodes. There are two types of reliability information; probability information from a check node to a bit node (hereinafter referred to as "external value" or "external information" and expressed by symbol "α") and probability information from a bit node to a check node (hereinafter referred to as "a priori probability," "posteriori probability" or simply "probability," or "logarithmic likelihood ratio (LLR)" and expressed by symbol "β" or "λ"). Reliability update processing is made up of row processing and column processing and the unit in which row processing and column processing are performed one time at a time is called "one iteration (round) processing" and decoding processing is performed by iterative processing which repeats iteration processing.

As described above, the external value α is probability information from a check node to a bit node during LDPC decoding processing and the probability β is probability information from a bit node to a check node and these are terms known to those skilled in the art.

Hereinafter, row processing and column processing will be described using part of a Tanner graph G2 shown in FIG. 3A to FIG. 3D. First, bit node processing (column processing) will be described using FIG. 3A and FIG. 3B. Suppose a certain LLR which is initial reliability of a codeword bit inputted corresponding to a certain bit node, for example, bit node 3 is λ(3) and a probability from a check node to the bit node 3 is α(j, 3). Here, j denotes a check node number connected to the bit node 3.

The bit node 3 carries out a calculation expressed by the following (Equation 1) on a check node of an edge corresponding to α(1, 3), that is, a check node 1.

$$\beta(3,1)=\lambda(3)+\alpha(2,3) \quad \text{(Equation 1)}$$

Likewise, the bit node 3 carries out a calculation expressed by the following (Equation 2) on a check node of node number j.

$$\beta(3,j)=\lambda(3)+\Sigma\alpha(k,3) \quad \text{(Equation 2)}$$

Here, Σ means the sum total other than k=j among check nodes connected to the bit node 3.

The above described calculations are performed on all bit nodes and β(i, j) expressed by the following (Equation 3) is calculated. Here, assuming the code length is N and node number is i, i=1 to N. Furthermore, Σ means the sum total other than k=j among the check nodes connected to the bit node i.

$$\beta(i,j)=\lambda(i)+\Sigma\alpha(k,i) \quad \text{(Equation 3)}$$

Figure 3B:
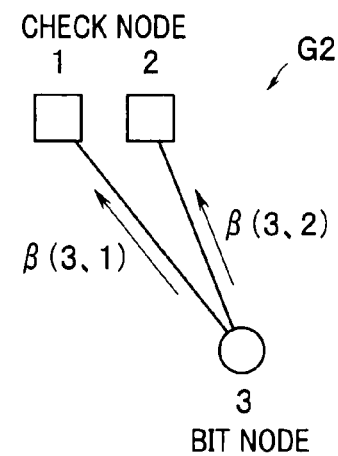
Figure 3C:
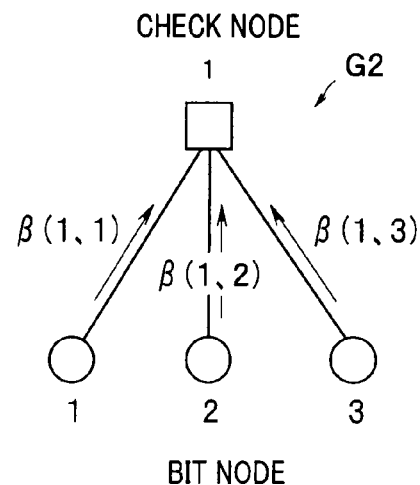

Next, check node processing (row processing) will be described using FIG. 3C and FIG. 3D. When external information which is a message to a certain check node, for example, the check node 1, is β(k, 1), this check node calculates α(1, 1) expressed by the following (Equation 4) on a bit node 1 which is a bit node of an edge corresponding to β(1, 1).

$$\alpha(1,1)=\text{sign}(\Pi\beta(m,1))\times\min(|\beta(m,1)|) \quad \text{(Equation 4)}$$

where, k is a bit node number connected to this check node 1. Here, m is selected from "2" and "3." Here, sign(Πβ(m, 1)) means sign ("+1" or "−1") of the result of multiplication of β(m, 1) by m=2 to 3. Furthermore, |β(m, 1)| is an absolute value of β(m, 1) and min is a function that selects a minimum value from among a plurality of |β(m, 1)|s.

Figure 3D:
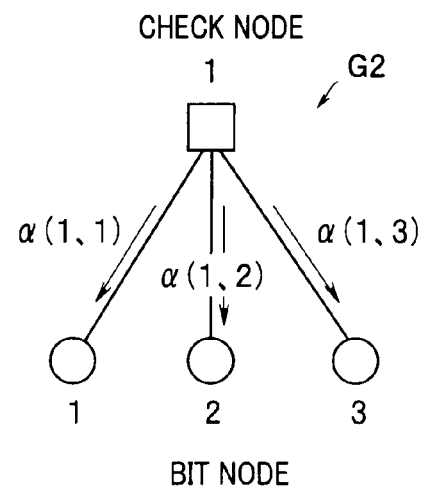

Likewise, α(1, i) will also be calculated using the following (Equation 5).

$$\alpha(1,i)=\text{sign}(\Pi\beta(m,1))\times\min\{|\beta(m,1)|\} \quad \text{(Equation 5)}$$

where, i is a bit node number connected to the check node 1 and is "1", "2" or "3" in the example of the Tanner graph in FIG. 3D. Furthermore, suppose m is any number other than m=i among the bit nodes connected to the check node 1.

The above described calculations are performed on all the check nodes and α(j, i) is calculated using the following (Equation 6).

$$\alpha(j,i)=\text{sign}(\Pi\beta(m,j))\times\min(|\beta(m,j)|) \quad \text{(Equation 6)}$$

where suppose m is any number other than m=i among the bit nodes connected to the check node j.

In iterative decoding, posteriori probability Pb(i) is calculated using the following (Equation 7) for every one iteration process (one round) in which the above described bit node processing and check node processing are executed one time respectively.

$$Pb(i)=\lambda(i)+\Sigma\alpha(k,i) \quad \text{(Equation 7)}$$

where i=1 to N, and N denotes a code length. Σ denotes the sum of all items connected to the bit node i.

Based on this posteriori probability value (temporary estimated word) Pb, a bit decision, that is, a hard decision is made as to whether the bit is "0" or "1." A parity check of the LDPC code is performed using this hard decision result and the iterative processing ends upon confirming that there is no error. This is the iterative decoding method for the LDPC code.

As has already been described, it is possible to perform decoding processing through parallel processing according to a reliability update algorithm at bit nodes and check nodes using a sum-product algorithm, a minisum algorithm or the like, as a message transmission algorithm.

In addition to the method disclosed in Japanese Patent Application Laid-Open Publication No. 2006-279396, there are some other methods for partial parallel processing. For example, there is a method of performing parallel processing using a check matrix configured by combining a plurality of unit matrixes (hereinafter also referred to as "block") and using operation circuits corresponding to bit nodes in the block size.

FIG. 4A shows a check matrix H3 configured by combining a plurality of unit matrixes. The check matrix H3 is configured by arranging six horizontal blocks and three vertical blocks, each block being made up of 5×5 elements, thus constituting vertically 15 rows and horizontally 30 columns.

As shown in FIG. 4B, each block B of the check matrix H3 is a square matrix (hereinafter, referred to as "shift matrix") obtained by shifting, by each numerical value, a unit matrix in which ones are arranged as a diagonal component and all other elements are zeros. The check matrix H3 shown in FIG. 4A is made up of a (message) block section H3A to be coded which is a block for user data and a parity block section H3B for parities generated from the user data. As shown in FIG. 3B, shift value "0" represents a unit matrix, shift value "−1" represents a 0 matrix. The 0 matrix requires no actual operation processing and will be therefore omitted in the following descriptions.

Overflowing bits produced by shift processing are inserted in the leftmost column in each block. In decoding processing using the check matrix H3, it is possible to obtain information on a necessary block, that is, information on a node to be processed by specifying a shift value. In the check matrix H3 made up of 5×5 blocks, a shift value is any one of five values of 0, 1, 2, 3 and 4 except 0 matrix which has no direct bearing on decoding processing.

In the case where the check matrix H3 combining square matrixes of block size 5×5 (hereinafter referred to as "block size 5") shown in FIG. 4A is used, it is possible to execute partial parallel processing on five check nodes by providing five operation units. Executing the partial parallel processing requires a bit node storage section (LMEM) configured to store a variable (hereinafter also referred to as "LMEM variable") to calculate an a priori/posteriori probability β in bit node units and a check node storage section (TMEM) configured to store a variable (hereinafter also referred to as "TMEM variable") to calculate an external value α in check node units. Since bit nodes are managed by addresses in the column direction (column addresses), LMEM is managed by column addresses, and since check nodes are managed by addresses in the row direction (row addresses), TMEM is managed by row addresses. When the external value α and the probability β are calculated, LMEM variables read from LMEM and TMEM variables read from TMEM are inputted to the operation circuit respectively and operation processing is executed.

Hereinafter, a method of rotating a plurality of TMEM variables read from TMEM according to a shift value will be described. That is, as shown in FIG. 5A to FIG. 6C, in the case of processing on eight TMEM variables read from a TMEM 132 using a check matrix H4 of block size 8, an error detection/correction circuit 101 uses an LMEM 126, a TMEM 126, an operation unit 130 and a rotator 132. The operation unit 130 is made up of eight operation circuits ALU 0 to ALU 8 and can perform eight processes in parallel. There are eight shift values 0 to 7 when the check matrix H3 of block size 8 is used.

Figure 6A:
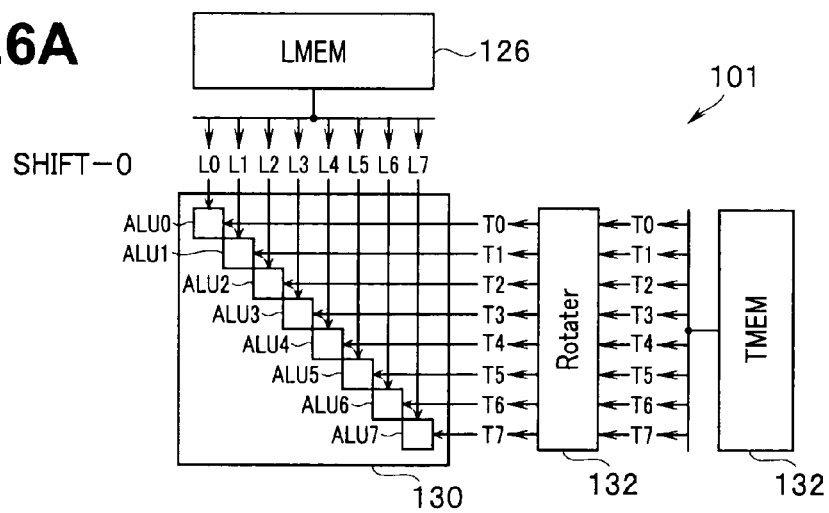
FIG. 6A to FIG. 6C are diagrams illustrating processing on a publicly known error detection/correction circuit.

As shown in FIG. 5A and FIG. 6A, in the case of block B (0) whose shift value is "0," the rotator 132 performs rotation processing with rotation value 0 and operation between variables of the same address is carried out. However, rotation processing with rotation value 0 is such processing that no rotation occurs. LMEM variable at column address 0, TMEM variable at row address 0 (shown by broken line in FIG. 5A) LMEM variable at column address 1, TMEM variable at row address 1
LMEM variable at column address 2, TMEM variable at row address 2
LMEM variable at column address 7, TMEM variable at row address 7 (shown by broken line in FIG. 5A)

Figure 6B:
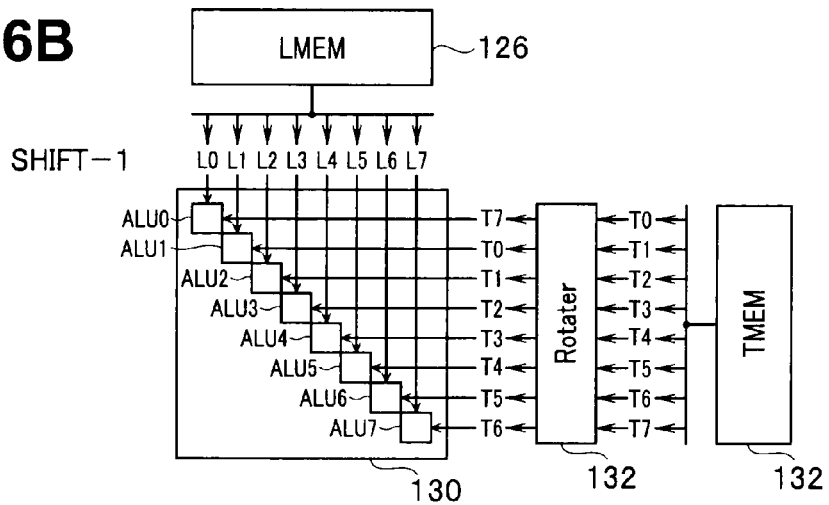

By contrast, in the case of block B (1) where the shift value is "1" as shown in FIG. 5B and FIG. 6B, the rotator 132 performs rotation processing with rotation value 1 and the following operation is carried out between variables. That is, the rotation processing with rotation value 1 is such shift processing that variables are moved down by one step and overflowing variables on the bottom row are inserted on the top row.
LMEM variable at column address 0, TMEM variable at row address 7 (shown by broken line in FIG. 5B)
LMEM variable at column address 1, TMEM variable at row address 0 (shown by broken line in FIG. 5B)
LMEM variable at column address 2, TMEM variable at row address 1
LMEM variable at column address 7, TMEM variable at row address 6

Figure 6C:
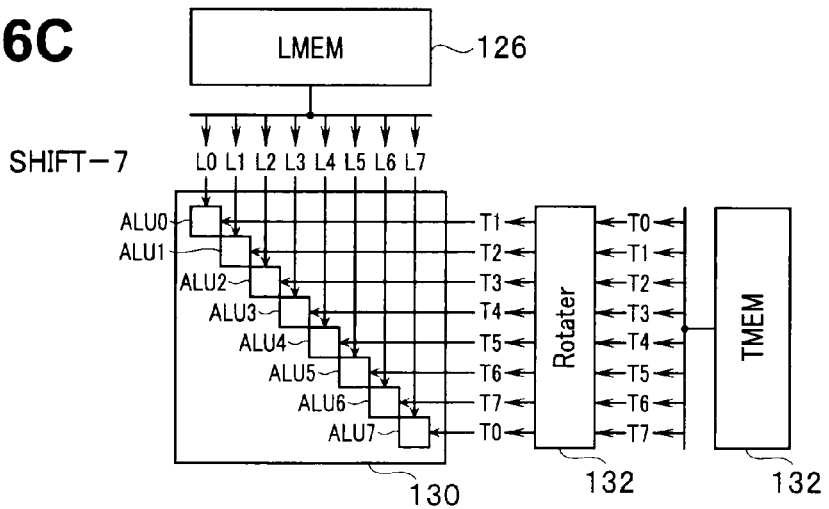

In the case of block B (7) whose shift value is "7" as shown in FIG. 6C, the rotator 132 performs rotation processing with rotation value 7 and performs the following operation between variables. That is, the rotation processing with rotation value 7 is such processing that rotation processing with rotation value 1 is performed seven times.
LMEM variable at column address 0, TMEM variable at row address 1
LMEM variable at column address 1, TMEM variable at row address 2
LMEM variable at column address 2, TMEM variable at row address 3
LMEM variable at column address 7, TMEM variable at row address 0

FIG. 7 illustrates a combination of operation circuit input variables for each block shift value (0 to 7).

As described above, before inputting variables read from the LMEM 126 or TMEM 132 to the operation unit 130, the rotator 132 performs rotation to a rotation value corresponding to the shift value of the block. In the case of the error detection/correction circuit 101 using the check matrix H3 of block size 8, the maximum rotation value of the rotator 132 is "7" which is "block size-1." When the number of quantization bits of reliability is assumed to be "u," the number of bits of the respective variables is "u" and therefore the input/output data width of the rotator 132 is "8×u" bits.

First Embodiment

Hereinafter, an error detection/correction circuit, a memory controller and a semiconductor memory apparatus (hereinafter also referred to as "error detection/correction circuit or the like") according to a first embodiment of the present invention will be described.

For simplicity of explanation, although a case has been described above where the block size or the like is extremely small (p=8 or the like) as an example, the block size p is as large as on the order of 128 to 256 for the error detection/correction circuit of the memory controller of the semiconductor memory apparatus. For this reason, the error detection/correction circuit of the first embodiment reduces the block size p and an operation circuit ALU required to be installed to 1/Y (Y is an integer equal to or greater than 2) to intentionally lower the level of parallelism. A case with Y=2 where the block size or the like is small (p=8) will be described below as an example also for simplicity of explanation.

First, the configurations of an error detection/correction circuit 1 of the first embodiment of the present invention, a memory controller 2 including the error detection/correction circuit 1 and a memory card 3 which is a semiconductor memory apparatus including the error detection/correction circuit 1 will be described using FIG. 8.

Figure 8:
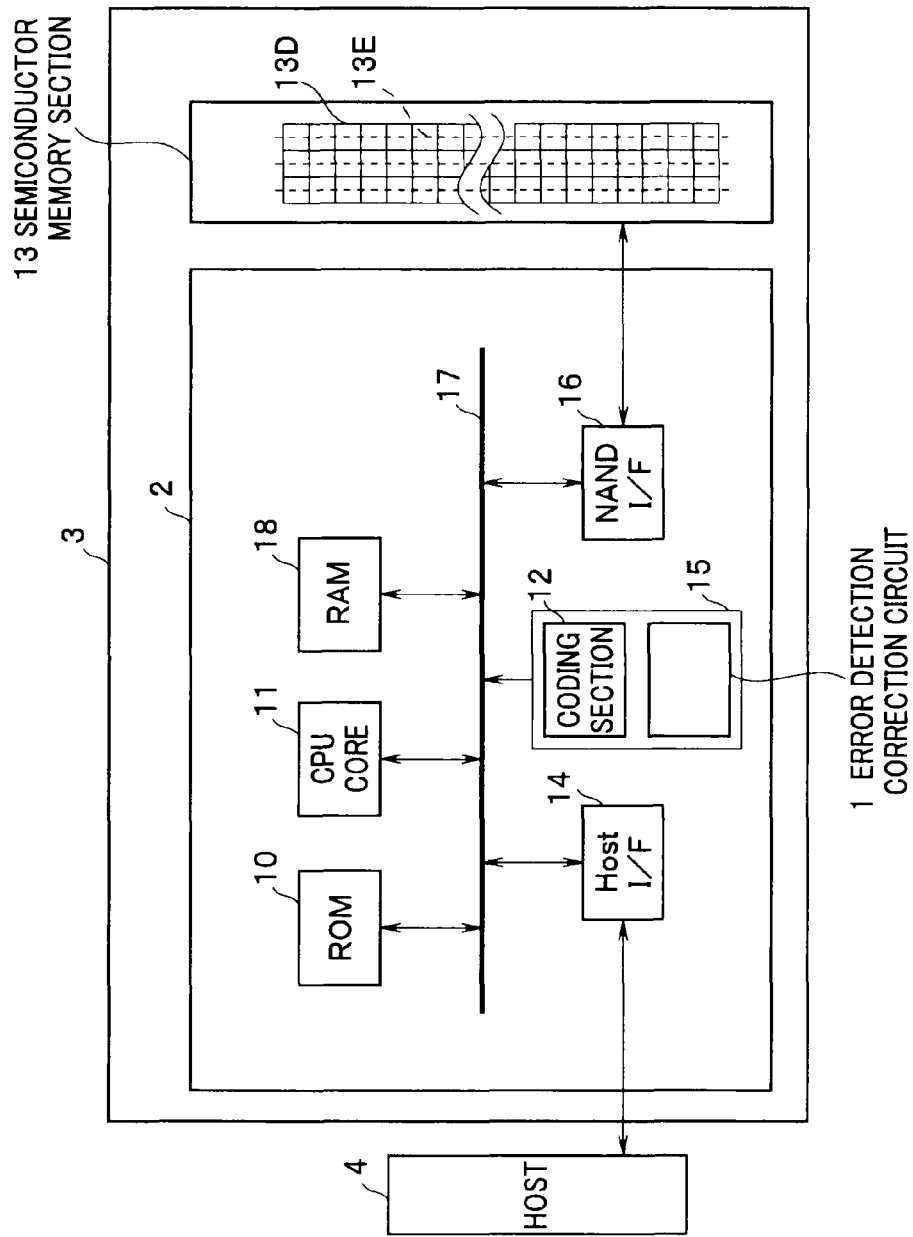
FIG. 8 is a configuration diagram illustrating a configuration of a memory card according to a first embodiment.

As shown in FIG. 8, the memory card 3 is a storage medium configured to store data received from a host 4 such as a personal computer or digital camera and transmit the stored data to the host 4. The memory card 3 includes a semiconductor memory section (hereinafter, simply referred to as "memory section") 13 and the memory controller 2 provided with the error detection/correction circuit 1. The memory section 13 is made up of a NAND-type flash memory and has a structure in which many memory cells 13D, which are unit cells, are connected via bit lines 13E or the like.

The memory controller 2 includes a ROM 10, a CPU core 11, a RAM 18, a host I/F (interface) 14, an error correcting (ECC: Error Correcting Code) circuit 15 and a NAND I/F (interface) 16 connected via a bus 17.

The memory controller 2 transmits/receives data to/from the host 4 via the host I/F 14 using the CPU core 11 and transmits/receives data to/from the memory section 13 via the NAND I/F 16. Furthermore, the memory controller 2 realizes address management of the memory section 13 including restrictions on the number of rewrites through FW (Firm Ware) executed by the CPU core 11. Moreover, control over the entire memory card 3 is also realized by FW according to a command input from the host 4. The ROM 10 stores a control program or the like of the memory card 3 and the RAM 18 stores an address conversion table or the like necessary for address management.

The ECC circuit 15 includes a coder 12 configured to generate and add an error correcting code when storing data and the error detection/correction circuit 1 configured to decode read coded data when reading data. The ECC circuit 15 of the present embodiment uses an LDPC codes which are error correcting codes subjected to decoding processing through probability-based iterative calculations.

Figure 9:
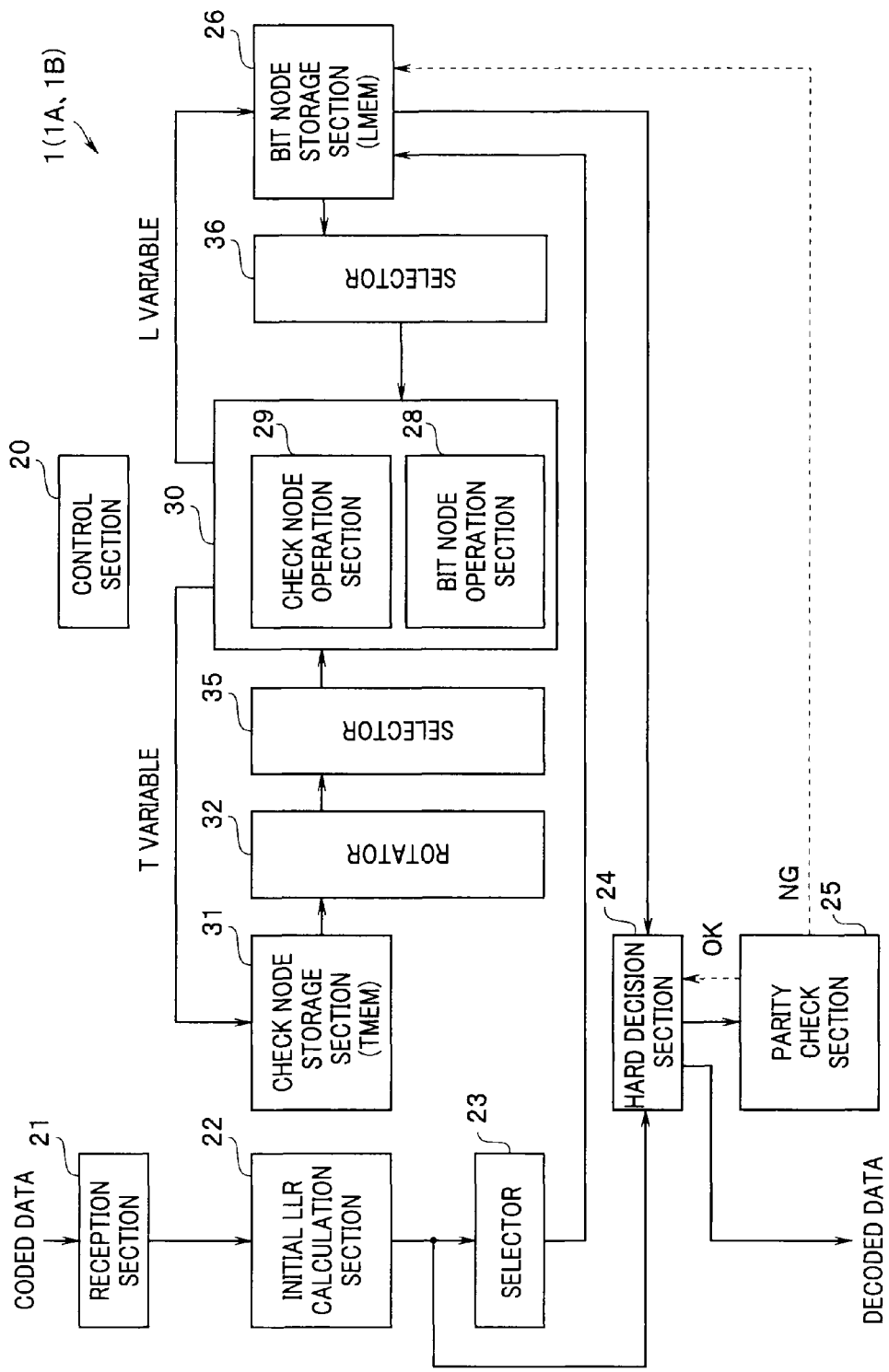
FIG. 9 is a configuration diagram illustrating a configuration of an error detection section of the first embodiment.
Figure 10:
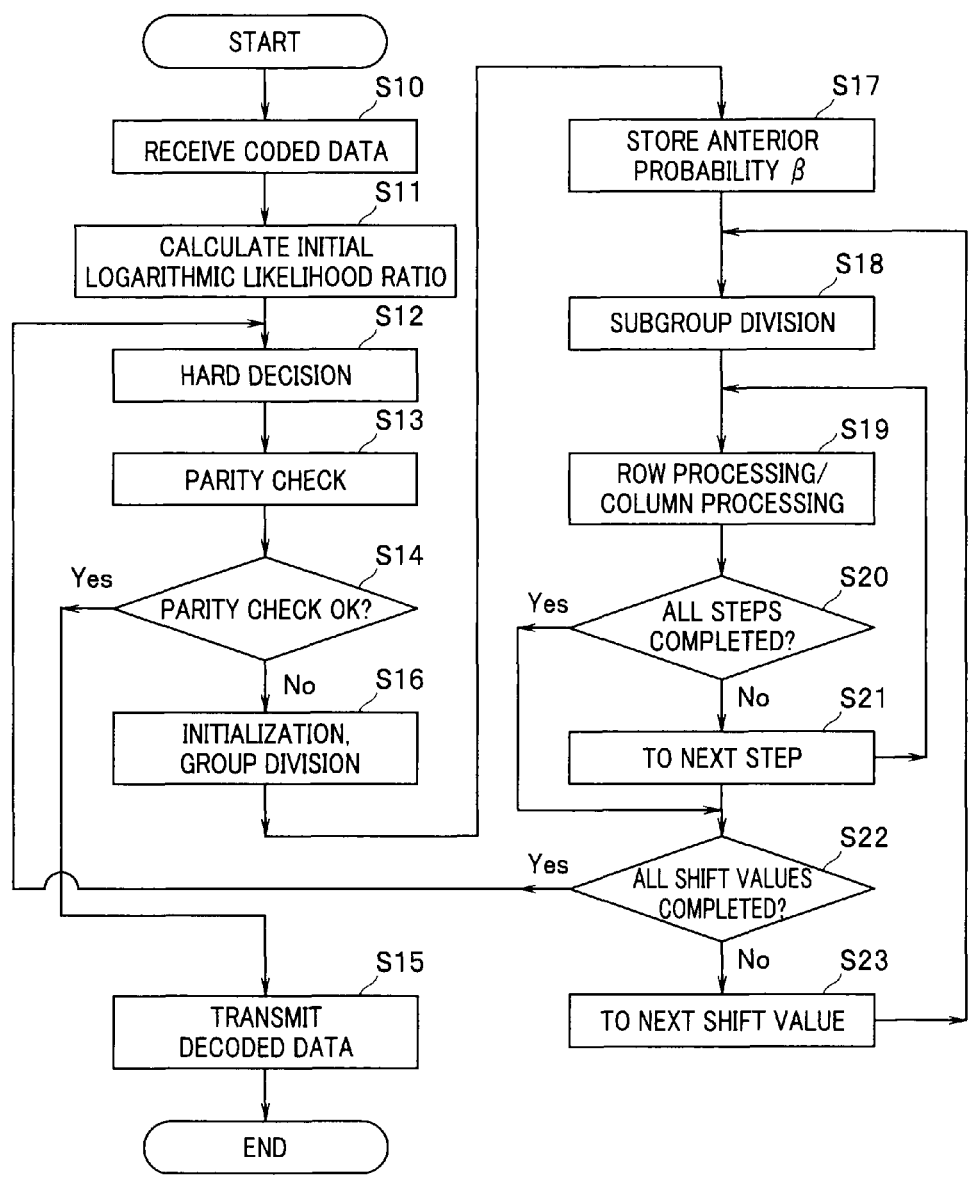
FIG. 10 is a flowchart illustrating a processing flow of an error detection/correction circuit of the first embodiment.
Figure 11A:
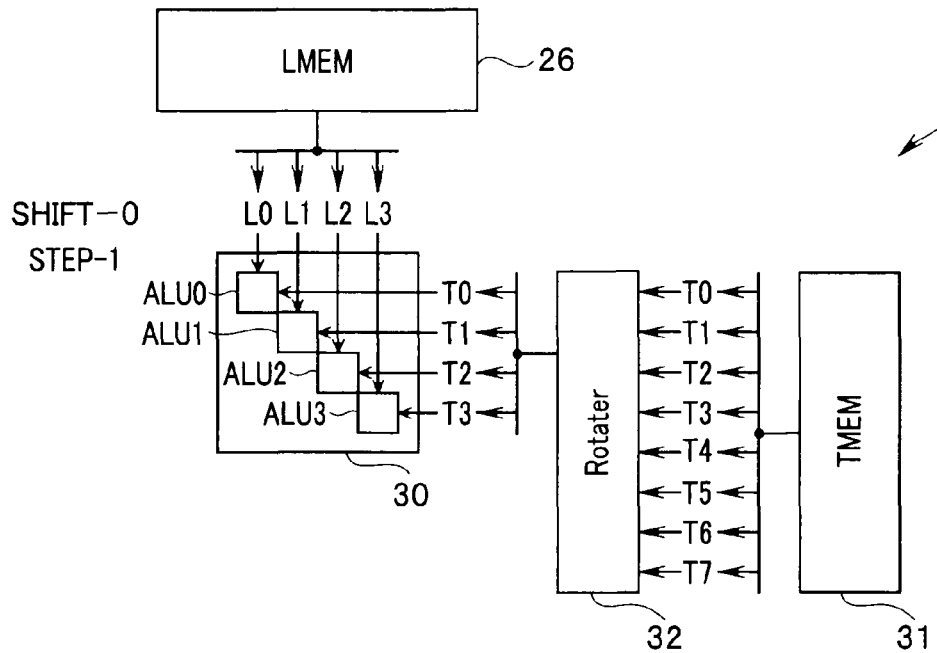
FIG. 11A and FIG. 11B are diagrams illustrating processing on the error detection/correction circuit of the first embodiment.
Figure 11B:
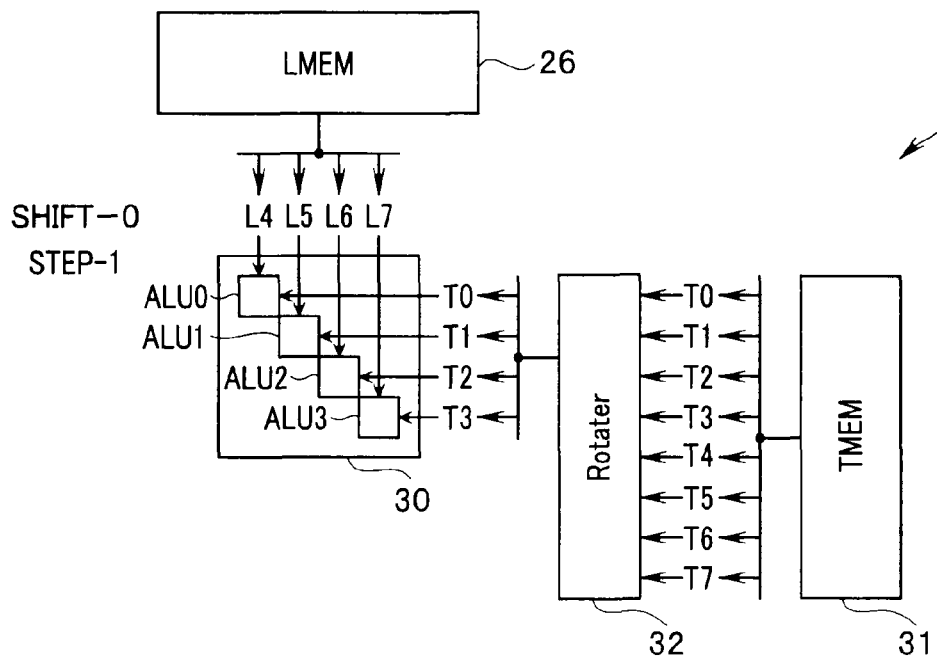
Figure 12A:
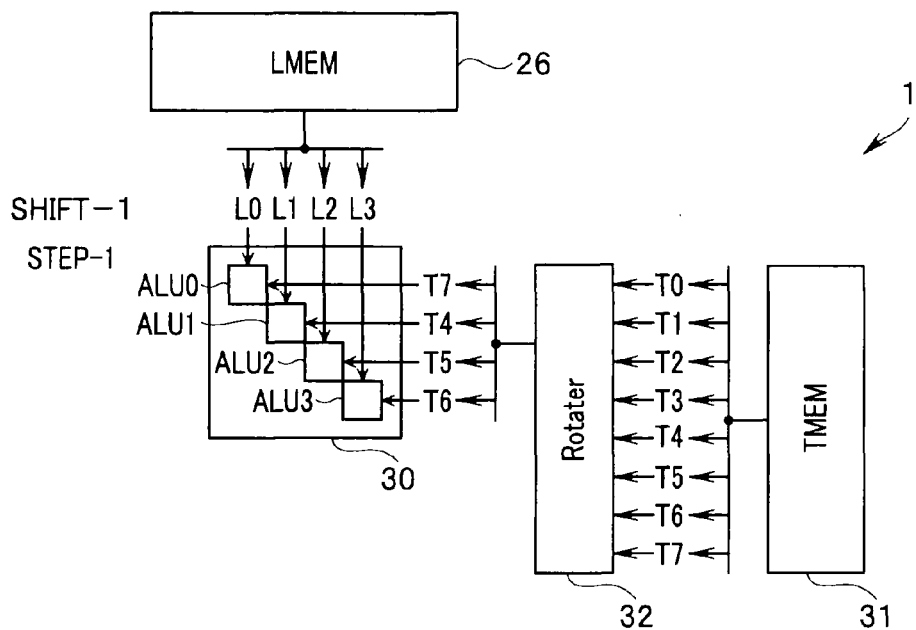
FIG. 12A and FIG. 12B are diagrams illustrating processing on the error detection/correction circuit of the first embodiment.
Figure 12B:
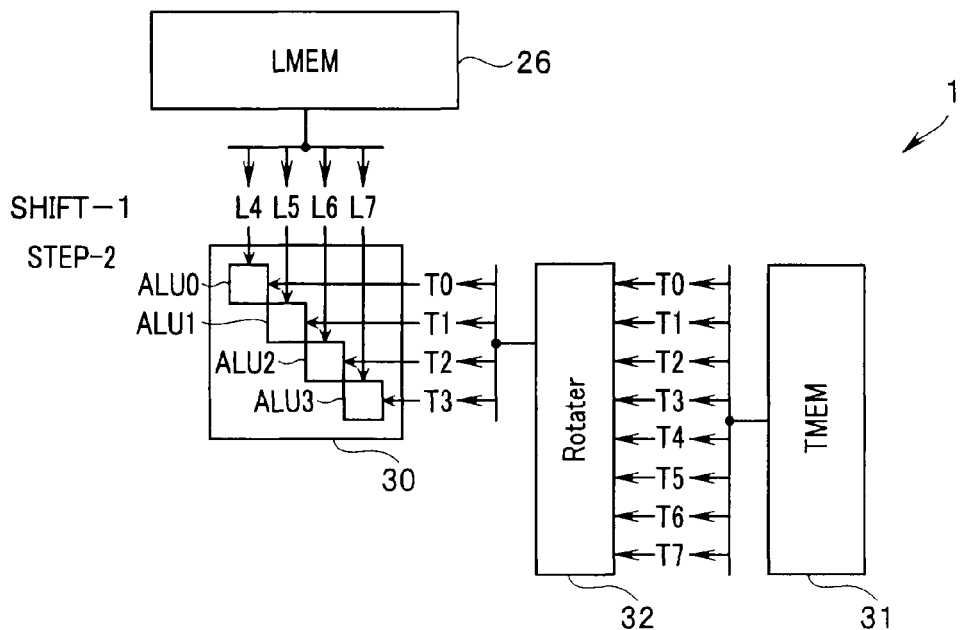
Figure 13A:
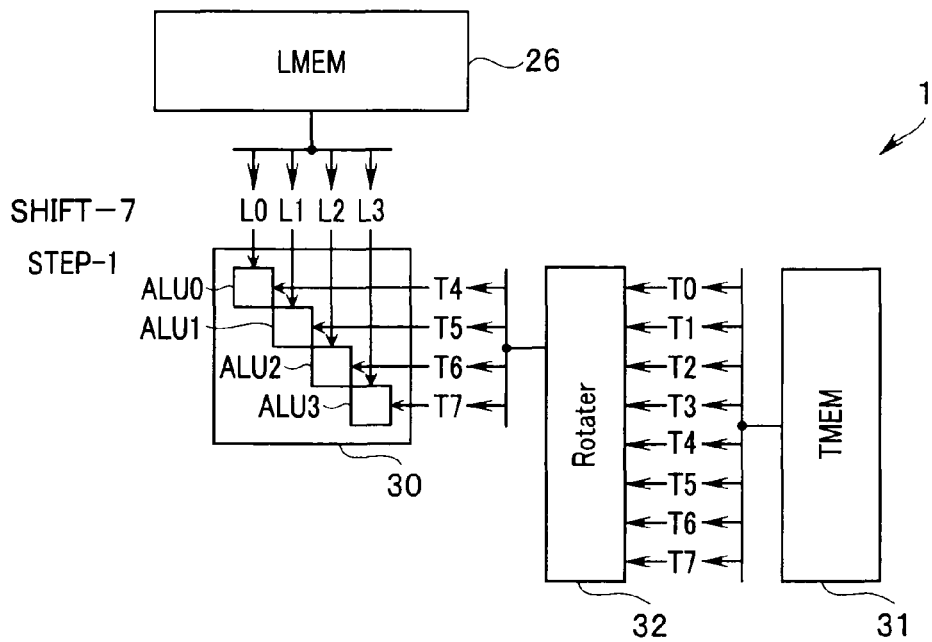
FIG. 13A and FIG. 13B are diagrams illustrating processing on the error detection/correction circuit of the first embodiment.
Figure 13B:
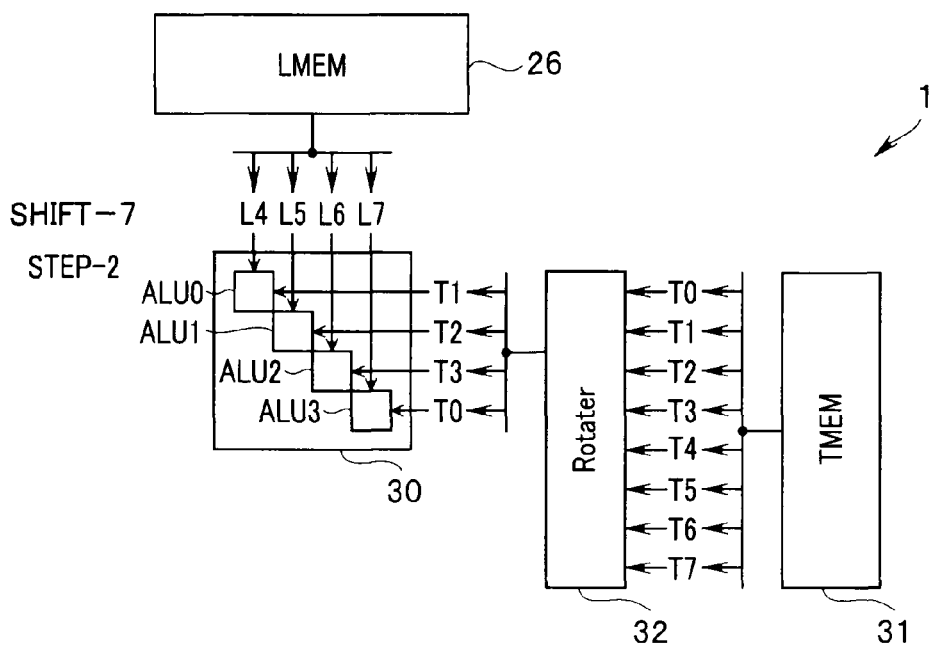
Figure 15A:
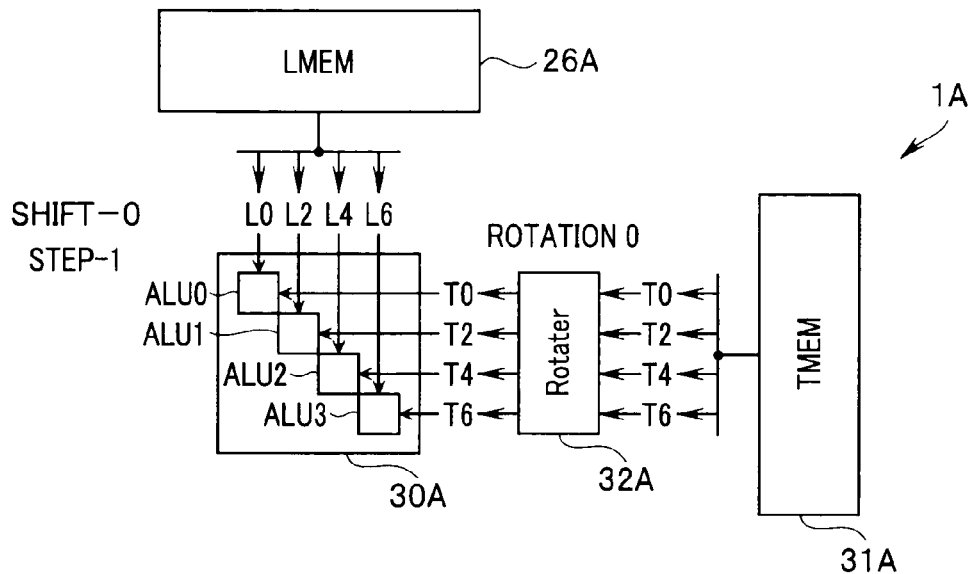
FIG. 15A and FIG. 15B are diagrams illustrating processing on an error detection/correction circuit according to a second embodiment.
Figure 15B:
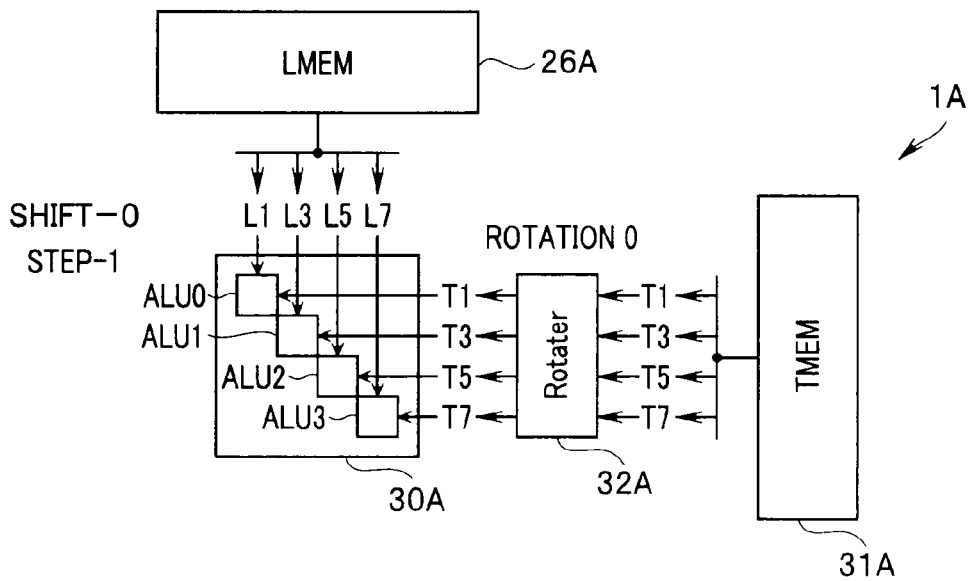
Figure 16A:
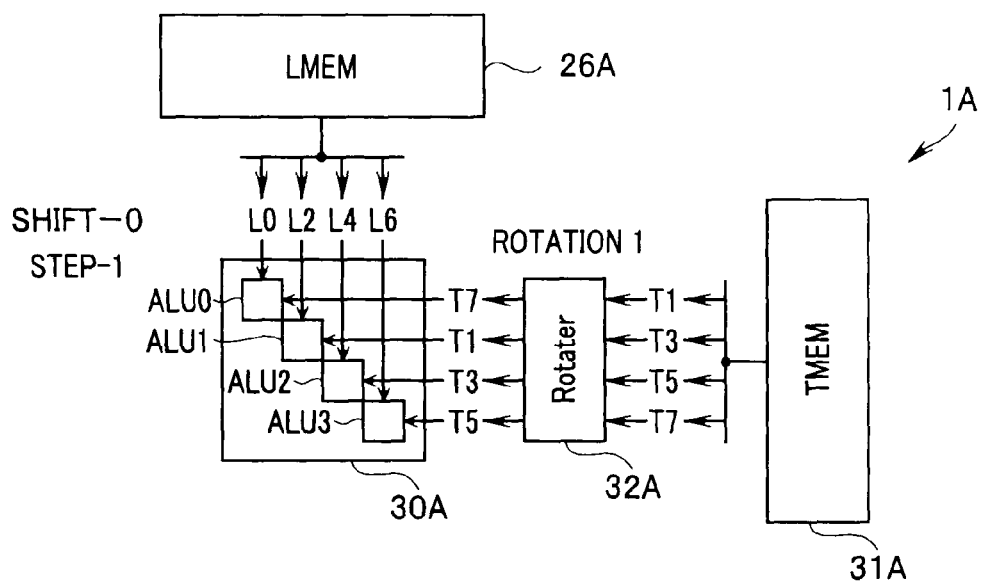
FIG. 16A and FIG. 16B are diagrams illustrating processing on the error detection/correction circuit of the second embodiment.
Figure 16B:
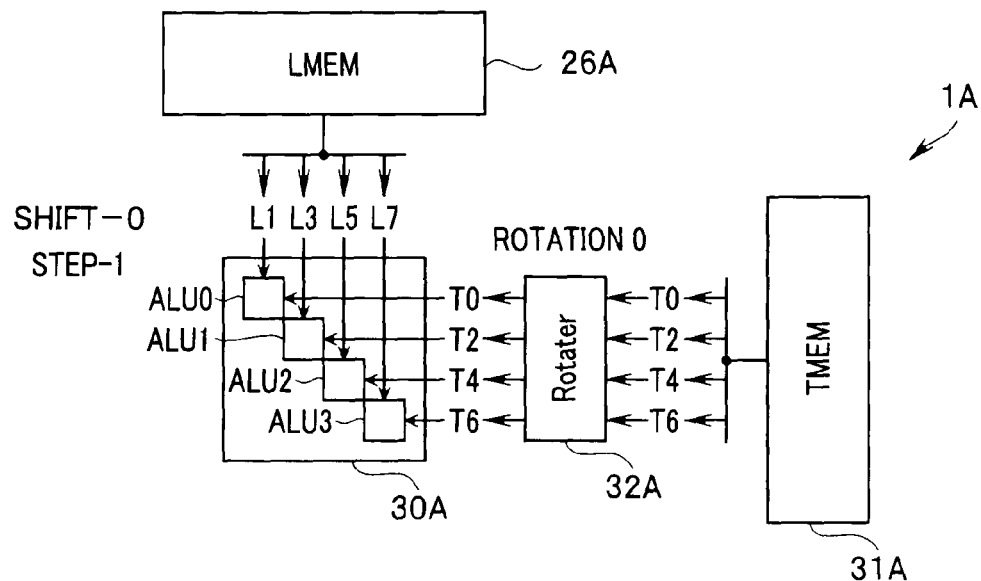

As shown in FIG. 9, the error detection/correction circuit 1 includes a control section 20, a reception section 21, an initial LLR calculation section 22, a hard decision section 24, a parity check section 25, a bit node storage section (LMEM) 26 which is a first memory, a rotator 32, a check node storage section (TMEM) 31 which is a second memory, an operation unit 30, a selector 23 which is a first selector and a selector 36 which is a second selector. The control section 20 performs control over the entire error detection/correction circuit 1, but may also be part of the CPU core 11. The reception section 21 receives coded data stored in the memory section 13 via the bus 17. Here, the coded data is inputted to the error detection/correction circuit 1 as a read voltage of, for example, a NAND-type flash memory. The initial LLR calculation section 22 calculates an initial LLR using a logarithmic likelihood ratio table or the like (not shown) based on the inputted coded data. The hard decision section 24 makes a hard decision on whether bit data is "0" or "1" based on posteriori probability (LLR).

The parity check section 25 performs a parity check on the hard-decided data. The selector 23 divides data into p (8) group units corresponding to the block size p of the check matrix under the control of the control section 20. The selectors 35 and 36 select and divide p/Y (4) subgroups of 1/Y (½) size from the respective groups under the control of the control section 20. That is, the respective division processes are performed by the selectors 23, 35 and 36 selecting only predetermined data. The bit node storage section (LMEM) 26 stores LMEM variables which are first variables to calculate a priori/posteriori probability β in bit node units. The check node storage section (TMEM) stores TMEM variables which are second variables to calculate an external value α in check node units. The rotator 32 performs rotation processing on TMEM variables to a predetermined rotation value under the control of the control section 20. The operation unit 30 includes a check node operation section 29 and a bit node operation section 28.

Next, an operation flow of the error detection/correction circuit 1 of the present embodiment will be described using FIG. 10 to FIG. 14.

<Step S10> Data Reception

The reception section 21 receives coded data stored in the memory section 13.

<Step S11> Initial LLR Value Reception

The initial LLR calculation section 22 calculates an initial LLR (a priori probability β) from the coded data based on a likelihood ratio table (not shown) or the like.

<Step S12> Hard Decision

A hard decision is made based on the LLR and a temporary estimated word is generated.

<Step S13> Parity Check

The parity check section 25 makes a parity check using the temporary estimated word.

<Step S14> Parity Check OK?

When the parity check result confirms no error (Yes), the parity check section 25 outputs decoded data to the host 4 via the host I/F 14 in step S15 and the processing ends.

<Step S16> Initialization/Division

When the parity check result shows an error (S14: No), the parity check section 25 initializes a shift value of a block to start iteration processing. Furthermore, the control section 20 divides data of the initial LLR which becomes an a priori probability β into group units of p (8) pieces of data through the selector 23 and performs the following processing in group units.

<Step S17> Storage of a Priori Probability β

An a priori probability β (LMEM variable) of a predetermined group is transmitted to the LMEM 26 and stored in association with an LMEM address which is a first address.

<Step S18> Subgroup Division

An LMEM variable stored in the LMEM 26 is divided into Y (2) subgroups by the selector 36 and sequentially subjected to processing from S19. Here, each subgroup is divided into a higher address subgroup and a lower address subgroup based on the LMEM address using, for example, an address median value as a reference. As will be described later, a TMEM variable is also divided into Y (2) subgroups by the selector 35 and processed. For example, the LMEM variable and TMEM variable are divided into subgroups LA and TA of addresses (0, 1, 2, 3) and subgroups LB and TB of addresses (4, 5, 6, 7).

<Step S19> Check Node Processing (Row Processing)/Bit Node Processing (Column Processing)

An a priori probability β is transmitted to the check node connected from the bit node and the check node operation section 29 calculates a product of received probabilities and transmits the product to the connected bit node as external information α. The external information α is stored in association with the TMEM address which is the second address in the TMEM 31.

At the check node, the external information α is transmitted to the connected bit node, the bit node operation section 28 calculates a product of received probabilities and transmits the product to the connected check node as a posteriori probability β. The posteriori probability β is stored in the LMEM 26 in association with the LMEM address which is the first address. When some variables are already stored in the TMEM 31 and LMEM 26, these variables are overwritten with new variables.

In this case, as shown in FIG. 11A to FIG. 14, when the shift value is an even number, the subgroup LA (variable addresses 0 to 3) and subgroup TA (variable addresses 0 to 3) are accessed in step 1, the subgroup LB (variable addresses 4 to 7) and subgroup TB (variable addresses 4 to 7) are accessed in step 2, and when the shift value is an odd number, the subgroup LA (variable addresses 0 to 3) and subgroup TB (variable addresses 4 to 7) are accessed in step 1 and the subgroup LB (variable addresses 4 to 7) and subgroup TA (variable addresses 0 to 3) are accessed in step 2. Here, "accessing a subgroup" means that the operation unit 30 performs operation processing using two accessed variables.

That is, the rotator 32 performs rotation processing according to the shift value and the rotation value on the TMEM variables stored in the TMEM 31 for every parallel processing and the selectors 35 and 36 select variables of the subgroup necessary for operation.

In FIG. 14 or the like, "rotation value 4 (0)" means that the order returns to "0" in one cycle through the rotation processing.

<Steps S20 to S23>

The row processing/column processing is performed until processing on all subgroups (step: rotation value)/group (shift value) is completed. That is, when p=8, Y=2, the processing in steps S18 to S23 is executed eight times and the processing in steps S19 to S21 is further executed twice in their respective iterative processes.

When one-round processing is completed, hard decision processing is performed in step S12, and further a parity check is made in step S13 and the processing is completed when the result is OK. When the result is NG, the processing from step S17 is repeatedly performed.

The error detection/correction circuit 1 described above can reduce the number of operation circuits ALU of the operation unit 30 from p (8) to p/Y (4), that is, 1/Y (½). That is, this is an error detection/correction circuit having a small circuit scale and high processing efficiency with reduced power consumption. Furthermore, the memory controller 2 having the error detection/correction circuit 1 and the memory card 3 which is a semiconductor memory apparatus having the error detection/correction circuit 1 demonstrate high processing efficiency.

When the block size p is 64 or above, the effect of the error detection/correction circuit 1 of the above described embodiment becomes apparent and more apparent when 256 or above. The upper limit of p is determined from mounting restrictions and is, for example, on the order of 1 k.

As described above, the error detection/correction circuit 1 of the present embodiment includes a first selector configured to divide received data into p groups based on a check matrix including a block made up of a unit matrix of a size p (p is an integer equal to or greater than 8) and a plurality of blocks in which each row of the unit matrix is shifted according to shift values from "1" to "p−1" by detecting codes from the received data using an algorithm of determining convergence and determining an estimate value of the received data by causing an external value α and a probability β to iteratively propagate between a plurality of check nodes and a plurality of bit nodes set in correspondence with a Tanner graph of the check matrix of low density parity check codes and making a parity check on a hard decision value of a posteriori value (posteriori probability: LLR) calculated from a probability β in the process, a second selector configured to further divide each of the groups into Y (Y is an integer equal to or greater than 2) subgroups, a first memory configured to store a plurality of first variables for performing calculation processing on the probability β in association with a first address, a second memory configured to store a plurality of second variables for performing calculation processing on the external value α in association with a second address, a rotator configured to perform rotation processing with a rotation value corresponding to the shift value and the subgroup on a plurality of the second variables stored in the second memory and transmit the plurality of the second variables to an operation unit, the operation unit made up of (p/Y) operation circuits that perform parallel operation processing using the first variable and the second variable in the subgroup units in conjunction with the shift value and a control section configured to control the first selector, the second selector, the operation unit and the rotator according to the shift value and the rotation value.

Second Embodiment

Hereinafter, an error detection/correction circuit 1A or the like according to a second embodiment of the present invention will be described with reference to the accompanying drawings. Since the error detection/correction circuit 1A or the like of the second embodiment is similar to the error detection/correction circuit 1 of the first embodiment, the same descriptions will be omitted.

The error detection/correction circuit 1 of the first embodiment reduces the number of operation circuits ALU of the operation unit 30 to 1/Y. However, "block size-1" of the maximum rotation value of the rotator needs to be kept for convenience of shift value control of blocks.

That is, here, suppose a case where control is performed so that TMEM variables T1 to T4 are inputted to the rotator on a first round and T5 to T8 are inputted on a second round. When the shift value of a block is "7," for example, the TMEM variable T1 needs to be rotated by 7 which is the maximum shift value (see FIG. 6B), but the rotator can rotate only a maximum of 4, and therefore the required function cannot be satisfied. That is, although the number of operation circuits can be reduced by half to 4, the number of rotation functions (circuit scale) of the rotator cannot be reduced by half accordingly. Furthermore, as for the number of TMEM variables inputted to the rotator 32, eight variables corresponding to the block size are necessary, and therefore the read data width of the TMEM 31 remains to be "8×u" bits. Furthermore, inputting four TMEM variables necessary for the operation unit 30 requires the selector 36 of "8u bits to 4u bits."

Thus, for the error detection/correction circuit having a block size of 256 and u=6 bits, the scale of the rotator as a single unit reaches 50K gates and the data bus width also becomes as enormous as 256×6 bits=1536 bits. Thus, it has been impossible to reduce the TMEM read data width, the rotator scale, the selector scale and the width of the data bus to which the circuit is connected or the like in proportion to the reduced number of operation units.

By contrast, the error detection/correction circuit 1A of the present embodiment divides the LMEM variables and TMEM variables not according to the size of addresses but based on the lower-order bits of addresses. For example, the LMEM variables and TMEM variables are divided into two groups; a subgroup (0, 2, 4, 6) Te having even-numbered addresses and a subgroup (1, 3, 5, 7) To having odd-numbered addresses based on the least significant address bit.

That is, having an even-numbered address means that the least significant address bit is "0" and having an odd-numbered address means that the least significant address bit is "1."

In iteration processing, the error detection/correction circuit 1A accesses, when the shift value is an even number, a subgroup Le and a subgroup Te in step 1 and accesses a subgroup Lo and the subgroup To in step 2, and accesses, when the shift value is an odd number, the subgroup Le and the subgroup To in step 1 and accesses the Lo and Te in step 2.

That is, when processing on the subgroup Le is executed in step 1 of the block operation processing and processing on the subgroup Lo is executed in step 2, if the block shift value is an even number, the subgroup Le executes operation with the subgroup Te in step 1 and the subgroup Lo executes operation with the subgroup To in step 2. When the block shift value is an odd number, the subgroup Le executes operation with the subgroup To in step 1 and the subgroup Lo executes operation with the subgroup Te in step 2. Thus, when the block shift value is an even number, the subgroup Le and the subgroup Te are accessed in step 1 and the subgroup Lo and the subgroup To are accessed in step 2. When the block shift value is an odd number, the subgroup Le and the subgroup To are accessed in step 1 and the subgroup Lo and subgroup Te are accessed in step 2.

That is, since the error detection/correction circuit 1A divides TMEM variables into subgroups based on lower-order bits, only subgroups necessary for operation processing are inputted to the rotator 32A.

Figure 17A:
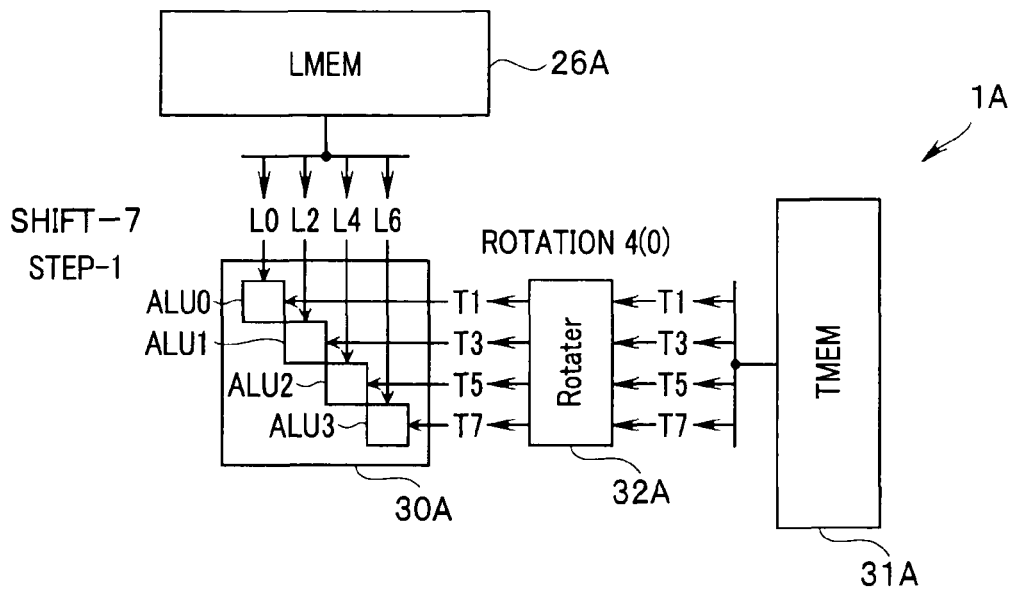
FIG. 17A and FIG. 17B are diagrams illustrating processing on the error detection/correction circuit of the second embodiment.
Figure 17B:
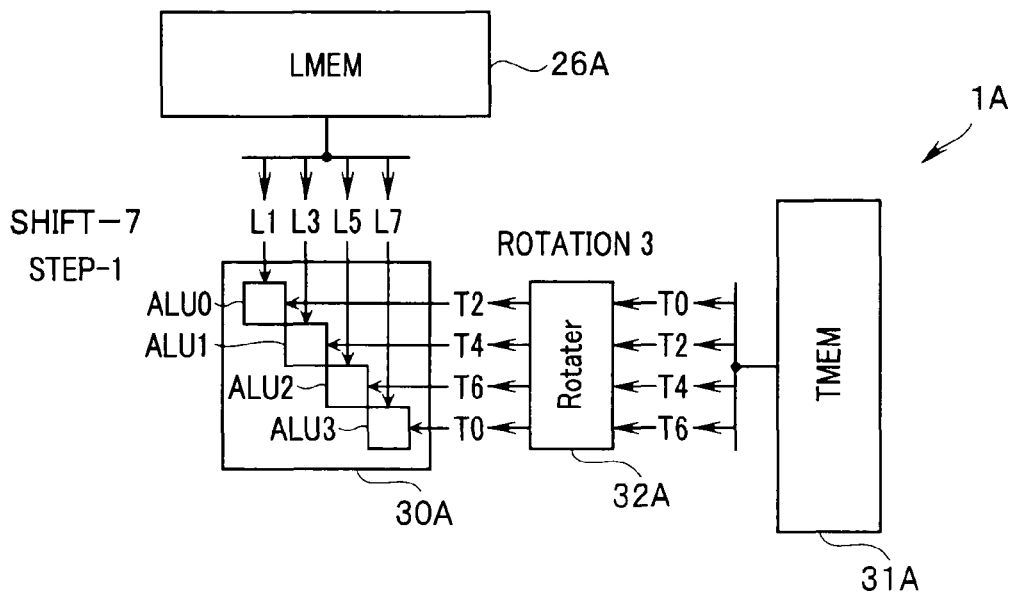
Figure 19A:
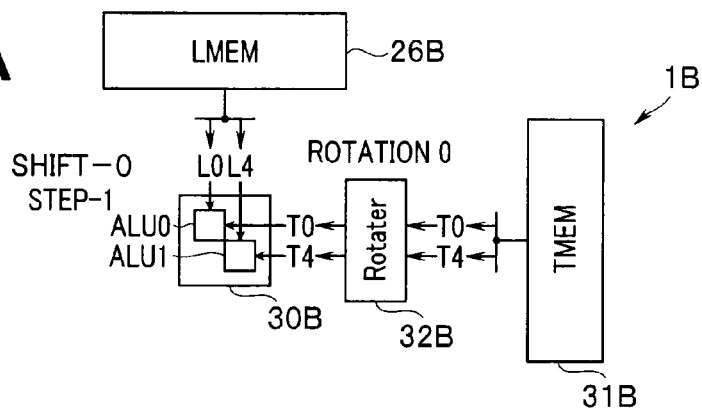
FIG. 19A to FIG. 19D are diagrams illustrating processing on an error detection/correction circuit according to a third embodiment.
Figure 19B:
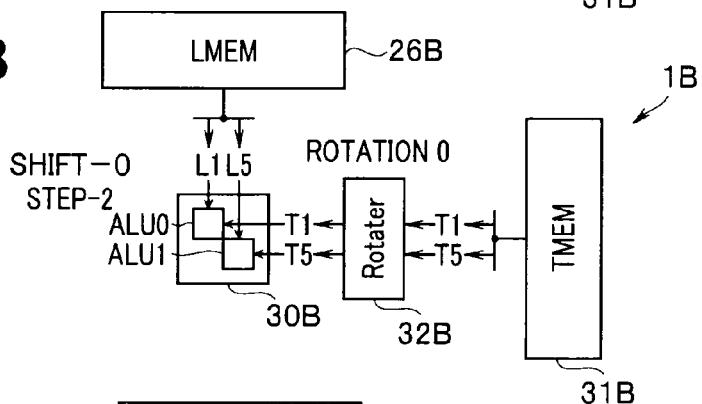
Figure 19C:
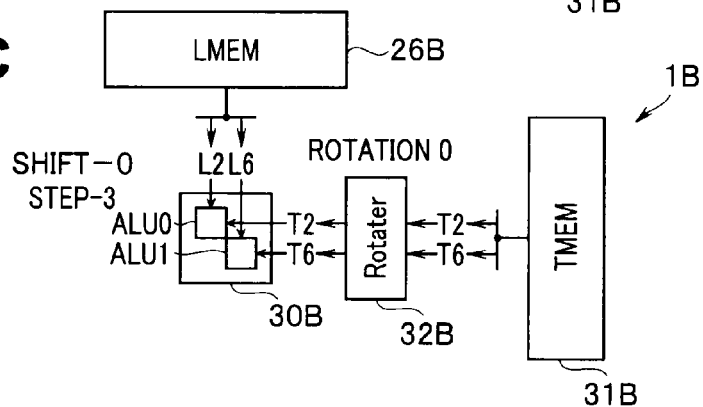
Figure 19D:
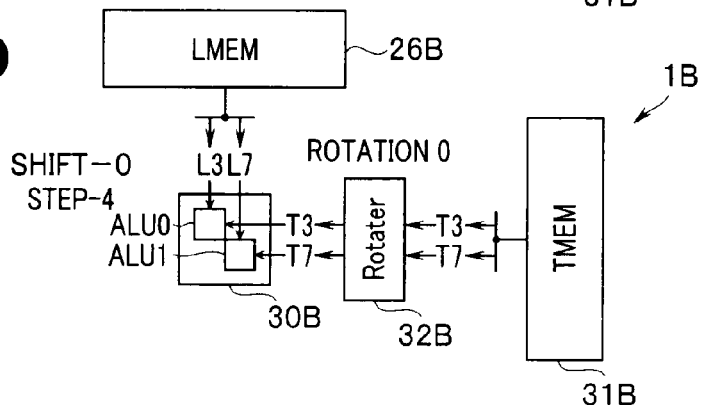
Figure 20A:
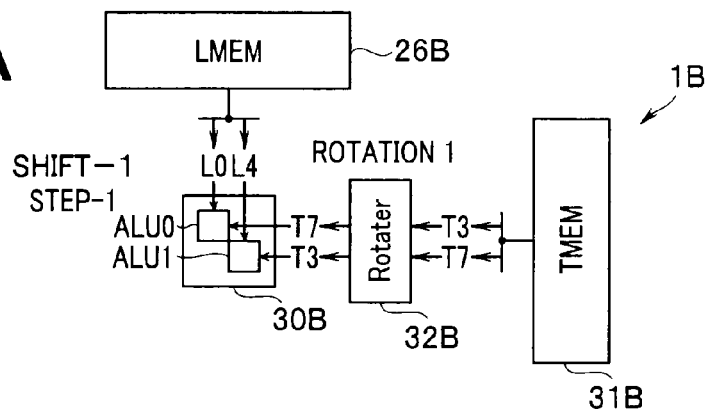
FIG. 20A to FIG. 20D are diagrams illustrating processing on the error detection/correction circuit of the third embodiment.
Figure 20B:
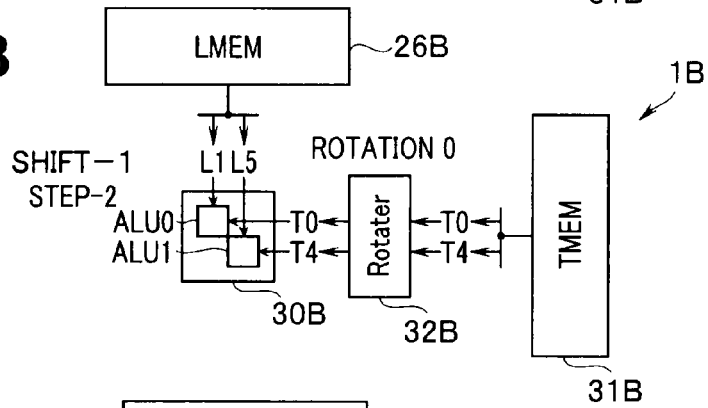
Figure 20C:
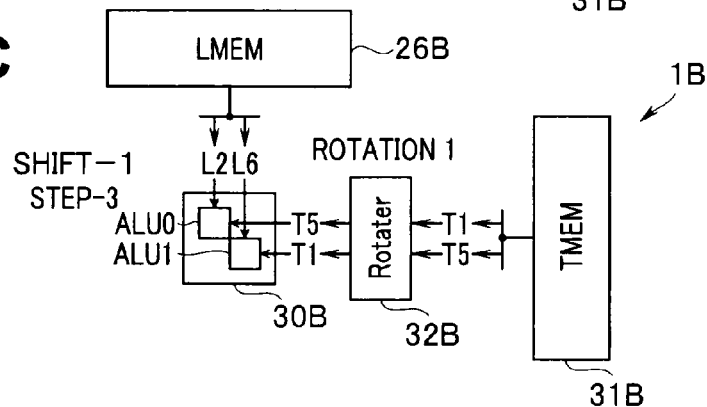
Figure 20D:
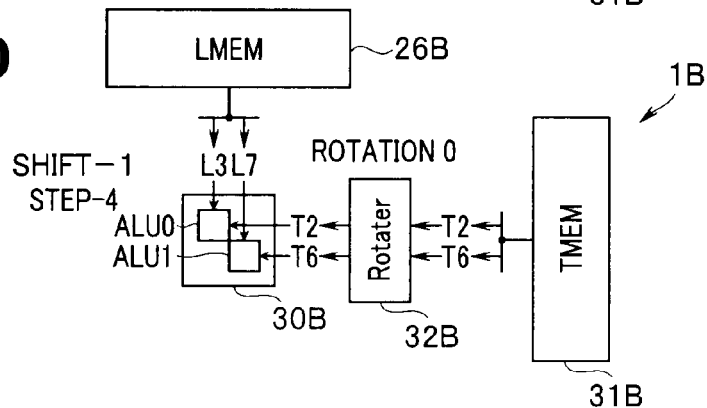
Figure 21A:
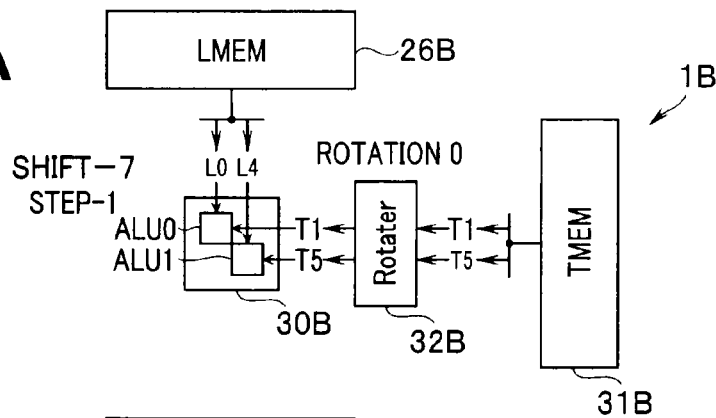
FIG. 21A to FIG. 21D are diagrams illustrating processing on the error detection/correction circuit of the third embodiment.
Figure 21B:
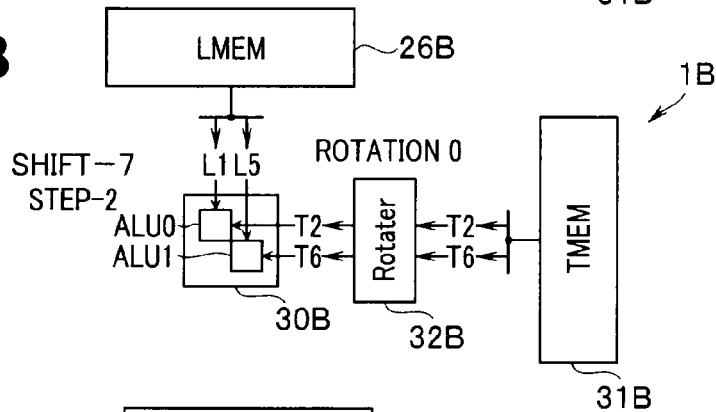
Figure 21C:
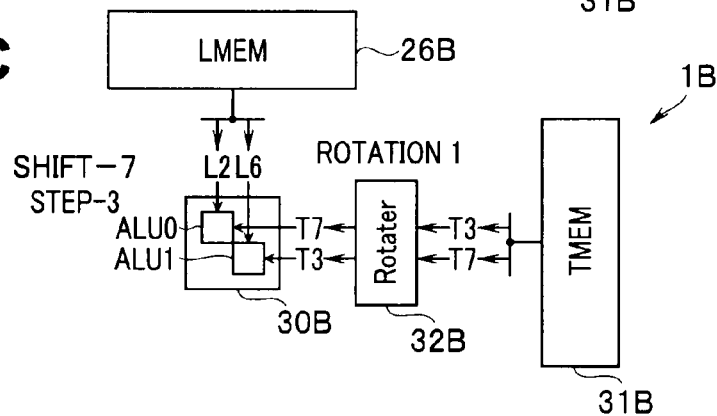
Figure 21D:
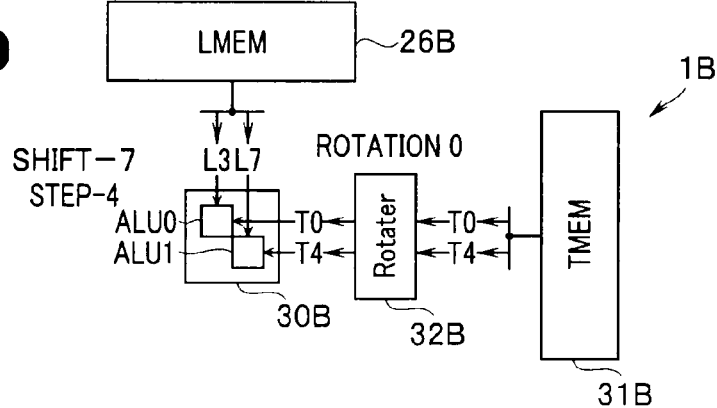

FIG. 15A to FIG. 17B illustrate relationships between TMEM variable rotation values in each shift value/each step of the error detection/correction circuit 1A. Furthermore, FIG. 17 shows a summary of shift values, steps and rotation values.

The error detection/correction circuit 1A can reduce not only the number of operation circuits of the operation unit 30A to 1/Y=½ but also the data width of the access unit (1 word) to the TMEM 31A from 8u bits to 4u bits, that is, to ½. Furthermore, the maximum rotation value and input/output data width of the rotator 32A, and the width of the data bus connecting the TMEM 31A, the rotator 32A and the operation unit 30A can also be reduced to ½. Furthermore, the selector 36 of "8u bits to 4u bits" is not necessary.

That is, in addition to the effect of the error correcting section 1 of the first embodiment, the error detection/correction circuit 1A can reduce the peripheral memory including the rotator, the circuit and the data bus width according to the number of operation circuits. That is, the error detection/correction circuit 1A is provided with scalability that allows the processing speed and circuit scale/power consumption to be flexibly adjusted.

As described above, the control section 20 of the error detection/correction circuit 1A of the present embodiment performs control so that each group is divided into two subgroups based on the least significant address bits of the first address and the second address.

Furthermore, the error detection/correction circuit 1A is provided with an error detection/correction processing function using LDPC codes and continuously executes row processing of propagating external information (α) to a plurality of bit nodes connected to a plurality of check nodes set in correspondence with a Tanner graph of a parity check matrix of LDPC codes and column processing of posteriori probability (β) to the plurality of check nodes from the plurality of bit nodes with respect to the selected bit nodes in one-round processing (round processing). In the round processing iteration process, the error detection/correction circuit 1A then makes a convergence decision using the posteriori value calculated from β, estimates code data and performs code detection from the input value. The error detection/correction circuit 1A then constitutes a check matrix by combining a plurality of square matrixes having a size of p×p (p is an integer equal to or greater than 8), includes a memory (LMEM) configured to store/manage variables to calculate a priori/posteriori probability β in bit node units and a memory (TMEM) configured to store/manage variables to calculate the external value α in check node units, has a function of performing operation processing in units of p bit nodes and p check nodes in conjunction with shift values of blocks, divides p bit nodes and check nodes into p/Y (Y is an integer equal to or greater than 2) subgroups, performs LMEM/TMEM access and rotation processing on accessed variables in units of variable groups corresponding to subgroups and performs subgrouping at lower addresses of LMEM/TMEM.

Furthermore, when performing operation processing, the error detection/correction circuit 1A is preferably provided with a function of determining the order of word access to LMEM or TMEM and rotation values of the rotator according to block shift values, and is particularly preferably provided with a function of determining word access order of TMEM and rotation values of the rotator when performing operation processing according to block shift values.

Third Embodiment

Hereinafter, an error detection/correction circuit 1B or the like according to a third embodiment of the present invention will be described with reference to the accompanying drawings. Since the error detection/correction circuit 1B or the like of the third embodiment is similar to the error detection/correction circuit 1A of the second embodiment, the same descriptions will be omitted.

The error detection/correction circuit 1B of the present embodiment corresponds to a case where the number of subgroups divided Y=4 and an operation unit 30B includes 2(8/4) operation circuits ALU. That is, LMEM variables and TMEM variables are divided into four subgroups and processed based on whether the lowest two address bits of variables stored in an LMEM 26B and a TMEM 31B are "00", "01", "10" or "11."

As in the case of the error detection/correction circuit 1A (Y=2) of the second embodiment, in the error detection/correction circuit 1B, the rotator 32B performs rotation processing on variable groups accessed by the control section 20 from the LMEM 26B and TMEM 31B for each shift value according to rotation values. That is, as shown in FIG. 19A to FIG. 21D, the control section 20 controls rotation values of the TMEM variables according to steps. FIG. 22 shows a summary of shift values, steps and rotation values in the error detection/correction circuit 1B.

In addition to the effects of the error detection/correction circuit 1A, the error detection/correction circuit 1B can further reduce circuit scale/power consumption. The upper limit of the number of subgroups divided Y is determined from a trade-off relationship between the processing speed and the circuit scale/power consumption as appropriate, but it is equal to or less than the block size p and, for example, 8.

As described above, in the error detection/correction circuit 1B of the present embodiment, the control section 20 performs control so that each group is divided into four subgroups based on the two lower address bits of the first address and the second address.

A memory system made up of the memory card 3 connected to the host 4 has been described above as an example, but as the memory system, a so-called embedded type NAND-type flash memory apparatus that is housed in the host 4 and configured to store startup data or the like of the host 4 can also obtain the same effect as that of the memory card 3 or the like. Furthermore, even an error detection/correction circuit such as digital television broadcasting receiver can obtain the same effect as that of the semiconductor memory system as long as it is an error detection/correction circuit that performs decoding on coded data through iterative calculation based on probability. Furthermore, the error detection/correction circuit may also operate by being read by a general-purpose CPU instead of a dedicated circuit.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An error detection/correction circuit comprising:
   a first selector configured to divide received data into p groups to output the groups based on a check matrix comprising a block made up of a unit matrix of a size p (p is an integer equal to or greater than 8) and a plurality of blocks in which each row of the unit matrix is shifted according to shift values from "1" to "p−1" when performing decoding processing on the received data coded with low density parity check codes;

a second selector configured to further divide each of the groups into Y (Y is an integer equal to or greater than 2) subgroups to output the subgroups;

a first memory configured to store a plurality of first variables for performing calculation processing on a probability β in association with a first address;

a second memory configured to store a plurality of second variables for performing calculation processing on an external value α in association with a second address;

a rotator configured to perform rotation processing with a rotation value corresponding to the shift value and the subgroup on the plurality of second variables stored in the second memory and transmits the plurality of second variables to an operation unit;

the operation unit comprising (p/Y) operation circuits configured to perform parallel operation processing using the first variable and the second variable in the subgroup units in conjunction with the shift value; and a control section configured to control the first selector, the second selector and the rotator according to the shift value and the rotation value.

2. The error detection/correction circuit according to claim 1, wherein the control section controls the division into the subgroups based on lower addresses of the first address and the second address.

3. The error detection/correction circuit according to claim 1, wherein the control section performs control so that each of the groups is divided into two subgroups based on the least significant address bits of the first address and the second address.

4. A memory controller comprising:
a first selector configured to divide received data into p groups to output the groups based on a check matrix comprising a block made up of a unit matrix of a size p (p is an integer equal to or greater than 8) and a plurality of blocks in which each row of the unit matrix is shifted according to shift values from "1" to "p−1" when performing decoding processing on the received data coded with low density parity check codes;

a second selector configured to further divide each of the groups into Y (Y is an integer equal to or greater than 2) subgroups to output the subgroups;

a first memory configured to store a plurality of first variables for performing calculation processing on a probability β in association with a first address;

a second memory configured to store a plurality of second variables for performing calculation processing on an external value α in association with a second address;

a rotator configured to perform rotation processing with a rotation value corresponding to the shift value and the subgroup on the plurality of second variables stored in the second memory and transmits the plurality of second variables to an operation unit;

the operation unit comprising (p/Y) operation circuits configured to perform parallel operation processing using the first variable and the second variable in the subgroup units in conjunction with the shift value; and a control section configured to control the first selector, the second selector and the rotator according to the shift value and the rotation value.

5. The memory controller according to claim 4, wherein the control section controls the division into the subgroups based on lower addresses of the first address and the second address.

6. The memory controller according to claim 4, wherein the control section performs control so that each of the groups is divided into two subgroups based on the least significant address bits of the first address and the second address.

7. A semiconductor memory apparatus comprising:
a memory controller comprising an error detection/correction circuit comprising:
a first selector configured to divide received data into p groups to output the groups based on a check matrix comprising a block made up of a unit matrix of a size p (p is an integer equal to or greater than 8) and a plurality of blocks in which each row of the unit matrix is shifted according to shift values from "1" to "p−1" when performing decoding processing on the received data coded with low density parity check codes;

a second selector configured to further divide each of the groups into Y (Y is an integer equal to or greater than 2) subgroups to output the subgroups;

a first memory configured to store a plurality of first variables for performing calculation processing on a probability β in association with a first address;

a second memory configured to store a plurality of second variables for performing calculation processing on an external value α in association with a second address;

a rotator configured to perform rotation processing with a rotation value corresponding to the shift value and the subgroup on the plurality of second variables stored in the second memory and transmits the plurality of second variables to an operation unit;

the operation unit comprising (p/Y) operation circuits configured to perform parallel operation processing using the first variable and the second variable in the subgroup units in conjunction with the shift value; and a control section configured to control the first selector, the second selector and the rotator according to the shift value and the rotation value; and a NAND-type flash memory section in which the memory controller reads and writes data.

8. The semiconductor memory apparatus according to claim 7, wherein the control section controls the division into the subgroups based on lower addresses of the first address and the second address.

9. The semiconductor memory apparatus according to claim 7, wherein the control section performs control so that each of the groups is divided into two subgroups based on the least significant address bits of the first address and the second address.

10. An error detection correction method comprising:
calculating a logarithmic likelihood ratio from a received signal when performing decoding processing on received data coded with low density parity check codes;
making a hard decision based on the logarithmic likelihood ratio or a probability β;
making a parity check based on the hard decision result;
dividing the received signal into p (p is an integer equal to or greater than 8) groups;
dividing each of the groups into Y (Y is an integer equal to or greater than 2) subgroups;
storing a plurality of first variables of the subgroup for performing calculation processing on the probability β in a first memory in association with a first address and storing a plurality of second variables of the subgroup for performing calculation processing on an external value α in a second memory in association with a second address; and
performing selection processing on the plurality of first variables stored in the first memory;

performing rotation processing on the plurality of second variables stored in the second memory; and performing parallel processing on the p/Y first variables subjected to selection processing and the p/Y second variables subjected to rotation processing through p/Y operation circuits, wherein the low density parity check codes are based on a check matrix comprising a block made up of a unit matrix of a size p (p is an integer equal to or greater than 8) and a plurality of blocks in which each row of the unit matrix is shifted according to shift values "1" to "p−1," and the groups correspond to the shift values and the rotation processing and the selection processing are executed based on rotation values according to the shift value and the subgroup.

11. The error detection correction method according to claim 10, wherein the subgroup division is performed based on lower addresses of the first address and the second address.

12. The error detection correction method according to claim 11, wherein the subgroup division is performed based on the least significant address bits of the first address and the second address.

* * * * *